US012170505B2

(12) United States Patent
Balteanu et al.

(10) Patent No.: US 12,170,505 B2
(45) Date of Patent: Dec. 17, 2024

(54) APPARATUS AND METHODS FOR ENVELOPE TRACKING

(71) Applicant: Skyworks Solutions, Inc., Irvine, CA (US)

(72) Inventors: Florinel G. Balteanu, Irvine, CA (US); Serge Francois Drogi, Flagstaff, AZ (US); Sabah Khesbak, Irvine, CA (US); Shayan Farahvash, Kensington, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/240,931

(22) Filed: Aug. 31, 2023

(65) Prior Publication Data

US 2023/0412126 A1  Dec. 21, 2023

Related U.S. Application Data

(63) Continuation of application No. 18/158,042, filed on Jan. 23, 2023, now Pat. No. 11,770,104, which is a
(Continued)

(51) Int. Cl.
*H03F 1/02* (2006.01)
*H03F 3/24* (2006.01)
(Continued)

(52) U.S. Cl.
CPC ........... *H03F 1/0216* (2013.01); *H03F 3/245* (2013.01); *H04B 1/3827* (2013.01); *H04B 1/40* (2013.01);
(Continued)

(58) Field of Classification Search
CPC ..... H03F 1/0216; H03F 3/245; H04B 1/3827; H04B 1/40
See application file for complete search history.

(56) References Cited

U.S. PATENT DOCUMENTS 7,496,339 B2   2/2009   Balteanu et al.
8,718,188 B2   5/2014   Balteanu et al.
(Continued)

OTHER PUBLICATIONS

Komatsuzaki et al. "A High Efficiency 3.6-4.0 GHz Envelope-Tracking Power Amplifier Using GaN Soft-Switching Buck-Converter," Aug. 2018, in 4 pages.
(Continued)

*Primary Examiner* — Patricia T Nguyen
(74) *Attorney, Agent, or Firm* — Knobbe, Martens, Olson & Bear, LLP

(57) ABSTRACT

Envelope tracking systems for power amplifiers are provided herein. In certain embodiments, an envelope tracker is provided for a power amplifier that amplifies a radio frequency (RF) signal. The envelope tracker controls a power amplifier supply voltage of the power amplifier based on an envelope signal indicating an envelope of the RF signal. The envelope tracker includes a first controllable resistance between a first regulated voltage and the power amplifier supply voltage and a second controllable resistance between a second regulated voltage and the power amplifier supply voltage. The first regulated voltage and the second regulated voltage are of different voltage levels.

20 Claims, 17 Drawing Sheets

Related U.S. Application Data continuation of application No. 17/247,707, filed on Dec. 21, 2020, now Pat. No. 11,595,005.

(60) Provisional application No. 62/959,476, filed on Jan. 10, 2020.

(51) Int. Cl.
    *H04B 1/3827*      (2015.01)
    *H04B 1/40*      (2015.01)

(52) U.S. Cl.
    CPC .. *H03F 2200/105* (2013.01); *H03F 2200/451* (2013.01)

(56) References Cited

U.S. PATENT DOCUMENTS

| | | |
|---|---|---|
| 8,786,371 B2 | 7/2014 | Popplewell et al. |
| 8,981,847 B2 | 3/2015 | Balteanu |
| 9,092,393 B2 | 7/2015 | Whitefield et al. |
| 9,118,277 B2 | 8/2015 | Balteanu et al. |
| 9,143,096 B2 | 9/2015 | Balteanu et al. |
| 9,189,430 B2 | 11/2015 | Ross et al. |
| 9,197,128 B2 | 11/2015 | Popplewell et al. |
| 9,294,054 B2 | 3/2016 | Balteanu et al. |
| 9,344,304 B1 * | 5/2016 | Cohen .............. H03F 3/19 |
| 9,445,371 B2 | 9/2016 | Khesbak et al. |
| 9,584,070 B2 | 2/2017 | Balteanu et al. |
| 9,606,947 B2 | 3/2017 | Ross et al. |
| 9,668,215 B2 | 5/2017 | Balteanu et al. |
| 9,673,707 B2 | 6/2017 | Popplewell et al. |
| 9,806,676 B2 | 10/2017 | Balteanu et al. |
| 9,831,834 B2 | 11/2017 | Balteanu et al. |
| 9,876,473 B2 | 1/2018 | Khesbak et al. |
| 9,893,682 B2 | 2/2018 | Zhu et al. |
| 9,935,582 B2 | 4/2018 | Balteanu et al. |
| 9,948,241 B2 | 4/2018 | Popplewell et al. |
| 9,990,322 B2 | 6/2018 | Whitefield et al. |
| 9,991,856 B2 | 6/2018 | Khesbak et al. |
| 10,080,192 B2 | 9/2018 | Balteanu et al. |
| 10,110,169 B2 | 10/2018 | Khesbak et al. |
| 10,164,582 B2 | 12/2018 | Zhu et al. |
| 10,181,820 B2 | 1/2019 | Balteanu et al. |
| 10,230,340 B1 * | 3/2019 | Khlat .............. H04B 1/0475 |
| 10,270,394 B2 | 4/2019 | Drogi et al. |
| 10,277,177 B2 | 4/2019 | Khesbak et al. |
| 10,333,470 B2 | 6/2019 | Balteanu et al. |
| 10,622,898 B1 | 4/2020 | Henzler et al. |
| 11,595,005 B2 | 2/2023 | Balteanu et al. |
| 11,652,501 B2 | 5/2023 | Kim et al. |
| 11,770,104 B2 | 9/2023 | Balteanu et al. |
| 2006/0068697 A1 | 3/2006 | Tanabe et al. |
| 2010/0315097 A1 | 12/2010 | Lesso |
| 2013/0021827 A1 | 1/2013 | Ye |
| 2014/0327483 A1 | 11/2014 | Balteanu |
| 2015/0155895 A1 * | 6/2015 | Perreault .............. H02M 3/07 330/297 |
| 2016/0056714 A1 | 2/2016 | Ek |
| 2016/0094186 A1 * | 3/2016 | Cohen .............. H03F 1/0233 330/297 |
| 2017/0005676 A1 | 1/2017 | Yan et al. |
| 2017/0033811 A1 | 2/2017 | Heo et al. |
| 2017/0228332 A1 | 8/2017 | Ross et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0294776 A1 | 10/2018 | Popplewell et al. |
| 2018/0351454 A1 | 12/2018 | Khesbak et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0123690 A1 | 4/2019 | Balteanu et al. |
| 2019/0190462 A1 | 6/2019 | Zhu et al. |
| 2019/0341888 A1 | 11/2019 | Drogi et al. |
| 2019/0372526 A1 | 12/2019 | Balteanu et al. |
| 2020/0028435 A1 | 1/2020 | Kim et al. |
| 2020/0067406 A1 | 2/2020 | Khesbak et al. |
| 2020/0099343 A1 | 3/2020 | Khesbak et al. |
| 2020/0127619 A1 | 4/2020 | Khesbak et al. |
| 2020/0154434 A1 | 5/2020 | Balteanu |
| 2020/0162028 A1 | 5/2020 | Balteanu et al. |
| 2020/0162030 A1 | 5/2020 | Drogi et al. |
| 2020/0259458 A1 | 8/2020 | Balteanu et al. |
| 2020/0259459 A1 | 8/2020 | Balteanu et al. |
| 2020/0313622 A1 | 10/2020 | Eichler et al. |
| 2020/0336110 A1 | 10/2020 | Drogi et al. |
| 2020/0343865 A1 * | 10/2020 | Balteanu .............. H03F 3/245 |
| 2020/0350878 A1 | 11/2020 | Drogi et al. |
| 2021/0075372 A1 * | 3/2021 | Henzler .............. H03F 3/189 |
| 2021/0152201 A1 | 5/2021 | Megretski et al. |
| 2021/0313936 A1 | 10/2021 | Garrett et al. |
| 2021/0408969 A1 | 12/2021 | Bang et al. |
| 2023/0054485 A1 * | 2/2023 | Hoversten .............. H03F 1/32 |

OTHER PUBLICATIONS

Sakata et al. "High Efficiency and Wide-band GaN Power Amplifier Techniques for 5G and beyond" Mitsubishi Electric Corporation, European Microwave Week 2019, in 35 pages.

\* cited by examiner

APPARATUS AND METHODS FOR ENVELOPE TRACKING

CROSS-REFERENCE TO RELATED APPLICATIONS

This application is a continuation of U.S. application Ser. No. 18/158,042, filed Jan. 23, 2023, and titled "APPARATUS AND METHODS FOR ENVELOPE TRACKING," which is a continuation of U.S. application Ser. No. 17/247,707, filed Dec. 21, 2020, and titled "APPARATUS AND METHODS FOR ENVELOPE TRACKING," which claims the benefit of priority under 35 U.S.C. § 119 of U.S. Provisional Patent Application No. 62/959,476, filed Jan. 10, 2020 and titled "APPARATUS AND METHODS FOR ENVELOPE TRACKING," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for Fifth Generation (5G) cellular communications in Frequency Range 1 (FR1).

SUMMARY

In certain embodiments, the present disclosure relates to a mobile device. The mobile device includes a transceiver configured to generate a radio frequency signal, a front end circuit including a power amplifier configured to amplify the radio frequency signal and to receive power from a power amplifier supply voltage, and a power management circuit including an envelope tracker configured to control the power amplifier supply voltage based on an envelope signal indicating an envelope of the radio frequency signal. The envelope tracker includes a multi-level supply modulator having an output electrically connected to the power amplifier supply voltage and a plurality of inputs configured to receive a plurality of regulated voltages including a first regulated voltage and a second regulated voltage of different voltage levels. The envelope tracker further includes a control circuit configured to control the multi-level supply modulator to selectively connect one or more of the plurality of regulated voltages to the output, and to control the multi-level supply modulator to provide a gradual transition from selecting the first regulated voltage to selecting the second regulated voltage.

In some embodiments, the mobile device further includes a battery operable to provide a battery voltage to the envelope tracker.

In various embodiments, the mobile device further includes an antenna configured to radiate a radio frequency wave in response to receiving an amplified radio frequency signal from the power amplifier.

In several embodiments, the multi-level supply modulator includes a first plurality of selectable paths between the first regulated voltage and the output, and a second plurality of selectable paths between the second regulated voltage and the output. According to a number of embodiments, at least a portion of the first plurality of selectable paths have different resistances from one another, and at least a portion of the second plurality of selectable paths have different resistances from one another. In accordance with some embodiments, the gradual transition includes a change from a first state in which all of the first plurality of selectable paths are selected and none of the second plurality of selectable paths are selected to a second state in which all of the second plurality of selectable paths are selected and none of the first plurality of selectable paths are selected.

In some embodiments, the control circuit is further configured to operate the multi-level supply modulator in a period of overlap in which both the first regulated voltage is connected to the output and the second regulated voltage is connected to the output. According to various embodiments, the multi-level supply modulator includes a first plurality of selectable paths between the first regulated voltage and the output, and a second plurality of selectable paths between the second regulated voltage and the output, the period of overlap corresponding to a state in which both at least one of the first plurality of selectable paths is selected and at least one of the second plurality of selectable paths is selected. In accordance with a number of embodiments, each of the first plurality of selectable paths has a different resistance from one another, the at least one of the first plurality of selectable paths corresponding to a highest resistance path of the first plurality of selectable paths. According to several embodiments, each of the second plurality of selectable paths has a different resistance from one another, the at least one of the second plurality of selectable paths corresponding to a highest resistance path of the second plurality of selectable paths.

In a number of embodiments, the envelope tracker further includes a supply voltage filter electrically connected between the output of the multi-level supply modulator and the power amplifier supply voltage.

In various embodiments, the envelope tracker further includes a multi-level supply DC-to-DC converter configured to receive a battery voltage and to generate the plurality of regulated voltages. According to several embodiments, the envelope tracker further includes a first supply voltage filter electrically connected between the output of the multi-level supply modulator and the power amplifier supply voltage. In accordance with some embodiments, the multi-level supply DC-to-DC converter is further configured to generate a DC voltage, the envelope tracker further including a second supply voltage filter electrically connected between the DC voltage and the power amplifier supply voltage.

In several embodiments, the envelope tracker is operable in a plurality of operating modes including an envelope tracking mode in which the envelope tracker controls the power amplifier supply voltage using envelope tracking, and an average power tracking mode in which the envelope tracker controls the power amplifier supply voltage using average power tracking.

In certain embodiments, the present disclosure relates to a method of envelope tracking. The method includes amplifying a radio frequency signal using a power amplifier, powering the power amplifier using a power amplifier supply voltage, and controlling the power amplifier supply voltage based on an envelope signal indicating an envelope of the radio frequency signal using an envelope tracker, including providing a plurality of regulated voltages including a first regulated voltage and a second regulated voltage of different voltage levels to a multi-level supply modulator, controlling the power amplifier supply voltage with an output of the multi-level supply modulator, and controlling the multi-level supply modulator to selectively connect one or more of the plurality of regulated voltages to the output and to gradually transition from selecting the first regulated voltage to selecting the second regulated voltage.

In a number of embodiments, the multi-level supply modulator includes a first plurality of selectable paths between the first regulated voltage and the output, and a second plurality of selectable paths between the second regulated voltage and the output. According to several embodiments, at least a portion of the first plurality of selectable paths have different resistances from one another, and at least a portion of the second plurality of selectable paths have different resistances from one another. In accordance with some embodiments, controlling the multi-level supply modulator to gradually transition includes changing the multi-level supply modulator from a first state in which all of the first plurality of selectable paths are selected and none of the second plurality of selectable paths are selected to a second state in which all of the second plurality of selectable paths are selected and none of the first plurality of selectable paths are selected.

In various embodiments, the method further includes controlling the multi-level supply modulator to operate in a period of overlap in which both the first regulated voltage is connected to the output and the second regulated voltage is connected to the output. According to a number of embodiments, the multi-level supply modulator includes a first plurality of selectable paths between the first regulated voltage and the output, and a second plurality of selectable paths between the second regulated voltage and the output, the period of overlap corresponding to a state in which both at least one of the first plurality of selectable paths is selected and at least one of the second plurality of selectable paths is selected. In accordance with several embodiments, each of the first plurality of selectable paths has a different resistance from one another, the at least one of the first plurality of selectable paths that is selected corresponding to a highest resistance path of the first plurality of selectable paths. According to some embodiments, each of the second plurality of selectable paths has a different resistance from one another, the at least one of the second plurality of selectable paths that is selected corresponding to a highest resistance path of the second plurality of selectable paths.

In several embodiments, the method further includes controlling the power amplifier supply voltage with the output of the multi-level supply modulator through a supply voltage filter.

In a number of embodiments, the method further includes generating the plurality of regulated voltages using a multi-level supply DC-to-DC converter that receives a battery voltage.

In various embodiments, the method further includes controlling the envelope tracker to operate in a selected mode chosen from a plurality of operating modes including an envelope tracking mode and an average power tracking mode.

In certain embodiments, an envelope tracking system is provided. The envelope tracking system includes a power amplifier configured to amplify a radio frequency signal and to receive power from a power amplifier supply voltage, and an envelope tracker configured to control the power amplifier supply voltage based on an envelope signal indicating an envelope of the radio frequency signal. The envelope tracker includes a multi-level supply modulator having an output electrically connected to the power amplifier supply voltage and a plurality of inputs configured to receive a plurality of regulated voltages including a first regulated voltage and a second regulated voltage of different voltage levels, the envelope tracker further including a control circuit configured to control the multi-level supply modulator to selectively connect one or more of the plurality of regulated voltages to the output, and to control the multi-level supply modulator to provide a gradual transition from selecting the first regulated voltage to selecting the second regulated voltage.

In various embodiments, the multi-level supply modulator includes a first plurality of selectable paths between the first regulated voltage and the output, and a second plurality of selectable paths between the second regulated voltage and the output. According to a number of embodiments, at least a portion of the first plurality of selectable paths have different resistances from one another, and at least a portion of the second plurality of selectable paths have different resistances from one another. In accordance with several embodiments, the gradual transition includes a change from a first state in which all of the first plurality of selectable paths are selected and none of the second plurality of selectable paths are selected to a second state in which all of the second plurality of selectable paths are selected and none of the first plurality of selectable paths are selected. According to some embodiments, the control circuit is further configured to operate the multi-level supply modulator in a period of overlap in which both the first regulated voltage is connected to the output and the second regulated voltage is connected to the output. In accordance with a number of embodiments, the multi-level supply modulator includes a first plurality of selectable paths between the first regulated voltage and the output, and a second plurality of selectable paths between the second regulated voltage and the output, the period of overlap corresponding to a state in which both at least one of the first plurality of selectable paths is selected and at least one of the second plurality of selectable paths is selected. According to several embodiments, each of the first plurality of selectable paths has a different resistance from one another, the at least one of the first plurality of selectable paths corresponding to a highest resistance path of the first plurality of selectable paths. In accordance with some embodiments, each of the second plurality of selectable paths has a different resistance from one another, the at least one of the second plurality of selectable paths corresponding to a highest resistance path of the second plurality of selectable paths.

In several embodiments, the envelope tracker further includes a supply voltage filter electrically connected between the output of the multi-level supply modulator and the power amplifier supply voltage.

In a number of embodiments, the envelope tracker further includes a multi-level supply DC-to-DC converter configured to receive a battery voltage and to generate the plurality of regulated voltages. According to a number of embodiments, the envelope tracker further includes a first supply voltage filter electrically connected between the output of the multi-level supply modulator and the power amplifier supply voltage. In accordance with several embodiments, the multi-level supply DC-to-DC converter is further configured to generate a DC voltage, the envelope tracker further including a second supply voltage filter electrically connected between the DC voltage and the power amplifier supply voltage.

In some embodiments, the envelope tracker is operable in a plurality of operating modes including an envelope tracking mode in which the envelope tracker controls the power amplifier supply voltage using envelope tracking, and an average power tracking mode in which the envelope tracker controls the power amplifier supply voltage using average power tracking.

DETAILED DESCRIPTION OF EMBODIMENTS

Figure 1:
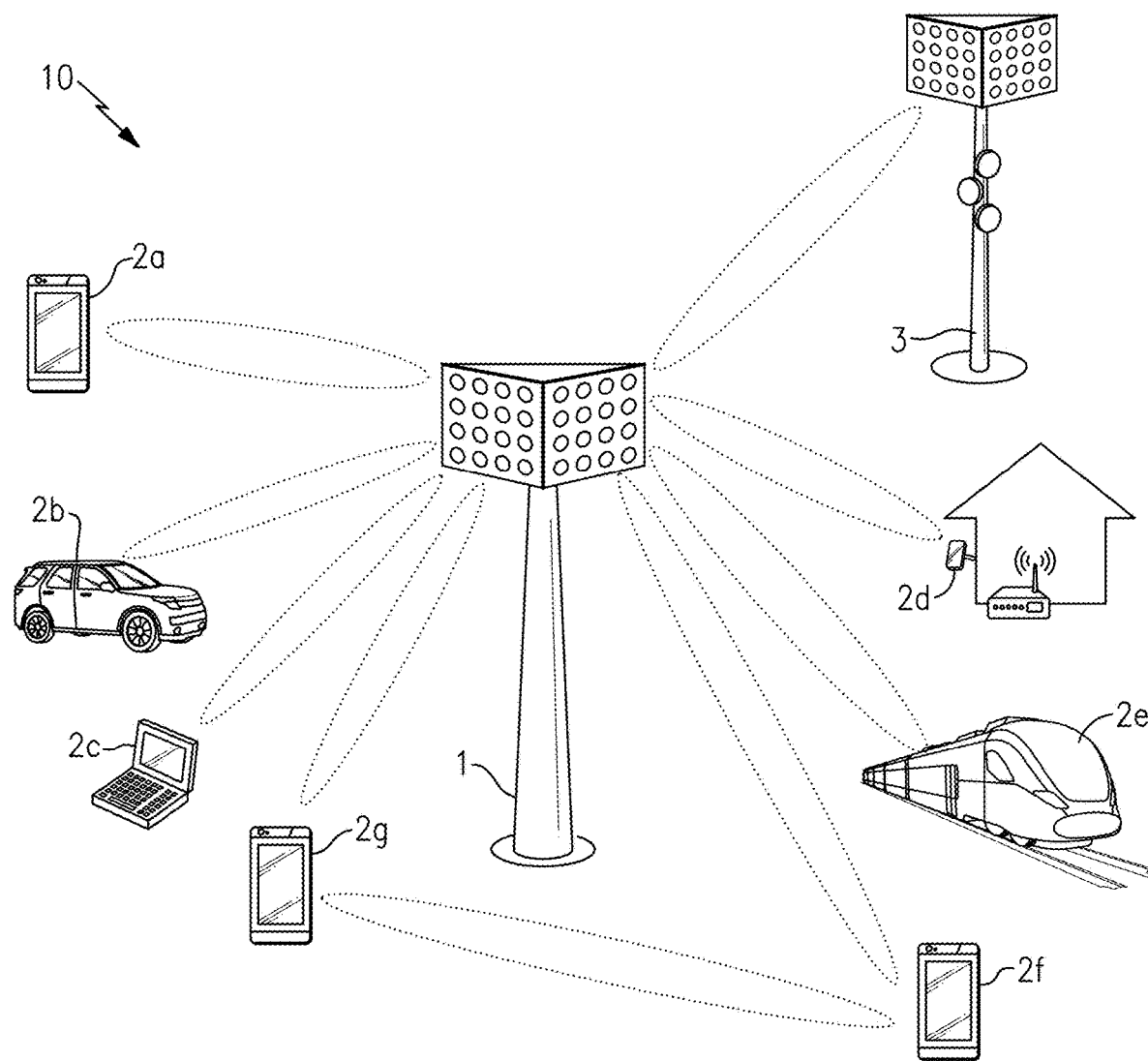
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
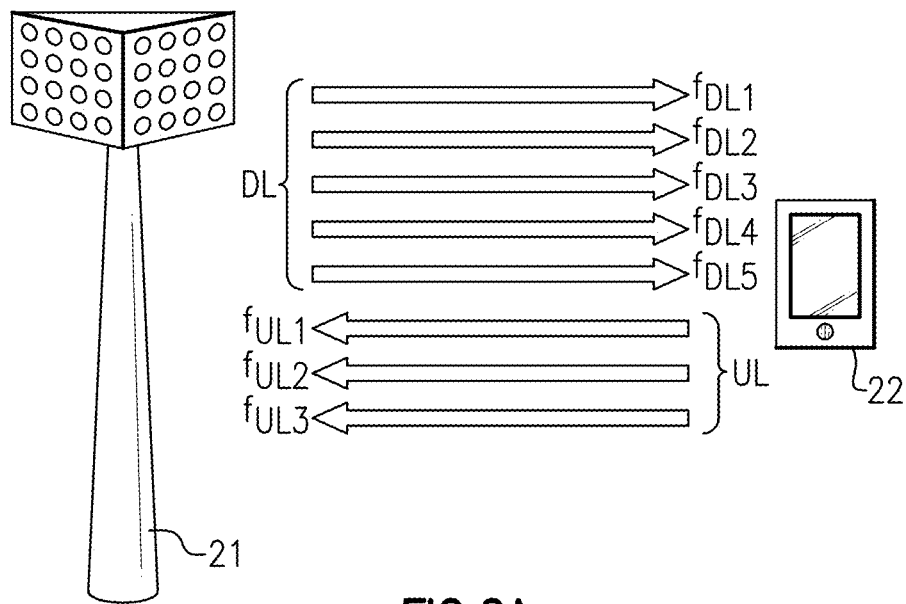
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
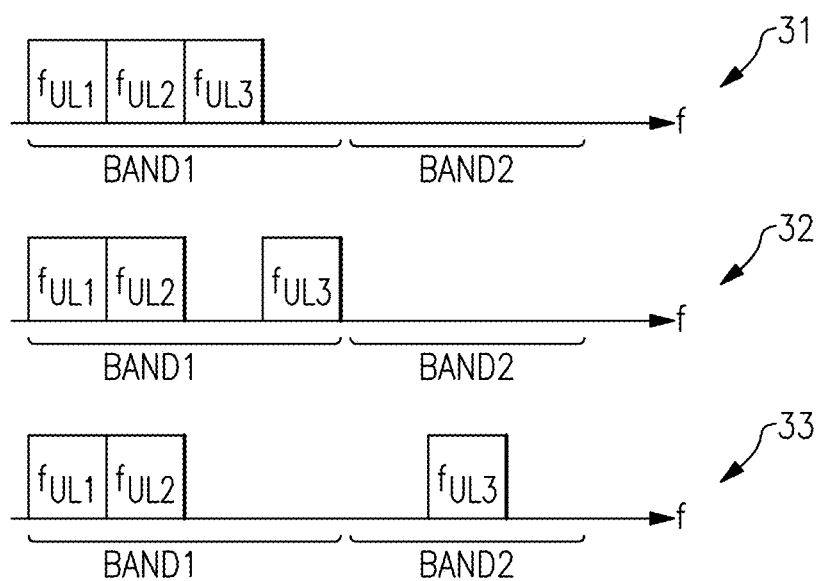
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier full, a second component carrier fuzz, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers fun_ and fuzz of a first frequency band BAND1 with component carrier $f_{UL3}$ of a second frequency band BAND2.

Figure 2C:
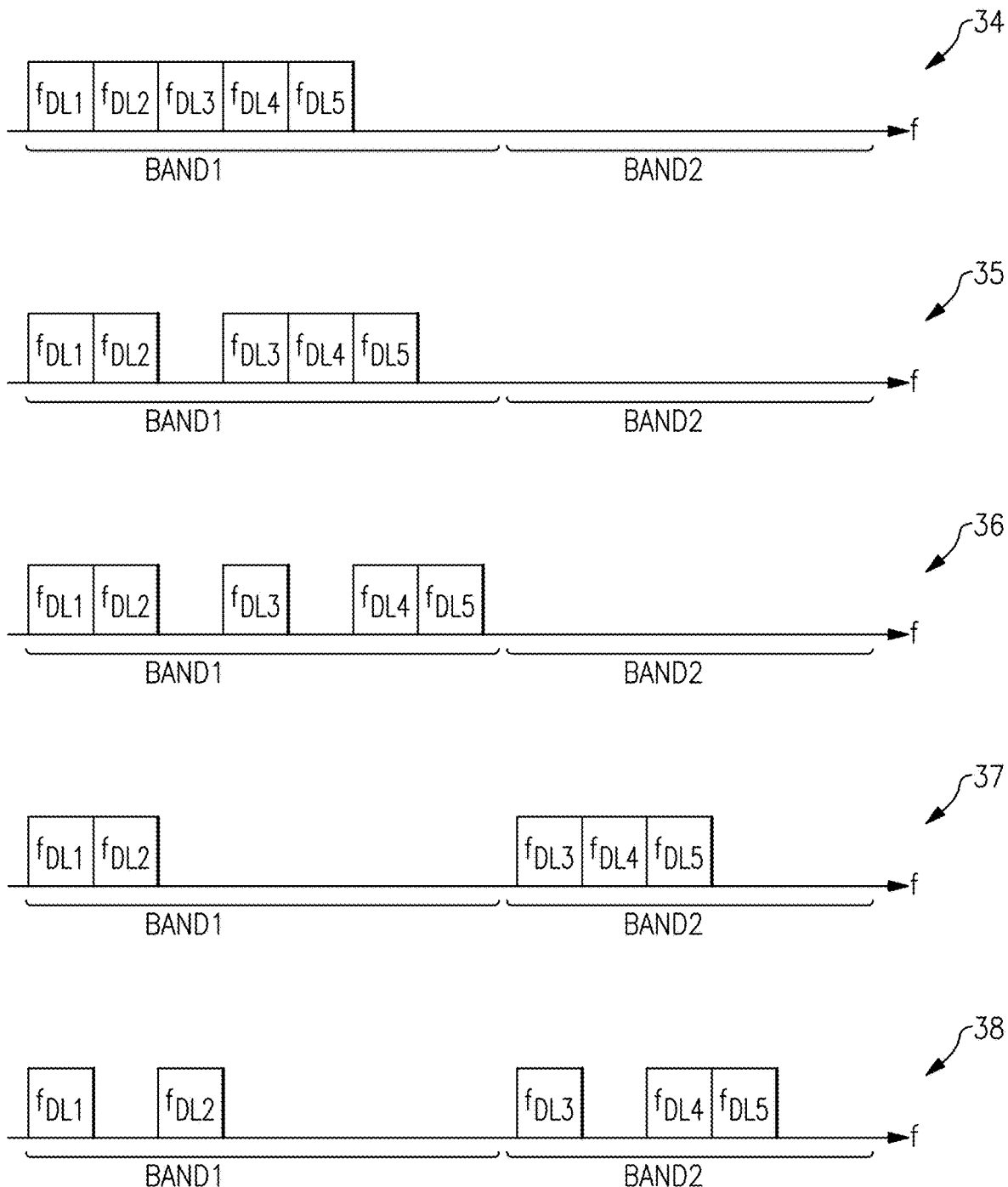
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL4}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Examples of MLS Envelope Tracking Systems with Soft Switching

Envelope tracking (ET) is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Envelope tracking systems for power amplifiers are provided herein. In certain embodiments, an envelope tracker is provided for a power amplifier that amplifies an RF signal. The envelope tracker includes a multi-level switching circuit having an output that provides an output current that changes in relation to an envelope signal indicating an envelope of the RF signal when the envelope tracker is operating in an envelope tracking mode. The multi-level switching circuit includes a multi-level supply (MLS) modulator that receives multiple regulated voltages of different voltage levels, and an MLS control circuit that controls the selection of the MLS modulator over time based on the envelope signal. When transitioning the MLS modulator from selection of one regulated voltage level to another regulated voltage level, the MLS control circuit provides a soft transition to gradually switch the regulated voltage levels.

By implementing the envelope tracker in this manner, reduced overshoot is provided. Moreover, lower quantization noise, relaxed output supply voltage filter constraints, and/or reduced power amplifier output noise can be achieved. Furthermore, the envelope tracker can be smoothly transitioned from an envelope tracking mode to another mode (for instance, an average power tracking (APT) mode or a fixed voltage mode) with little to no overshoot or ringing.

In certain implementations, the MLS modulator includes multiple paths associated with different resistance levels between the output of the MLS modulator and a particular one of the regulated voltages. Additionally, the soft transition is provided by changing selection amongst the paths of different resistances to provide a gradual transition or soft switching. In certain implementations, the MLS modulator operates with periods of overlap in which two different regulated voltages are both connected to the output of the MLS modulator through resistive paths.

Thus, in certain implementations, the MLS control circuit processes the envelope signal to open or close particular switches of the MLS modulator to thereby provide a soft transition when the MLS modulator is transitioned from selection of one regulated voltage level to another regulated voltage level.

Figure 3A:
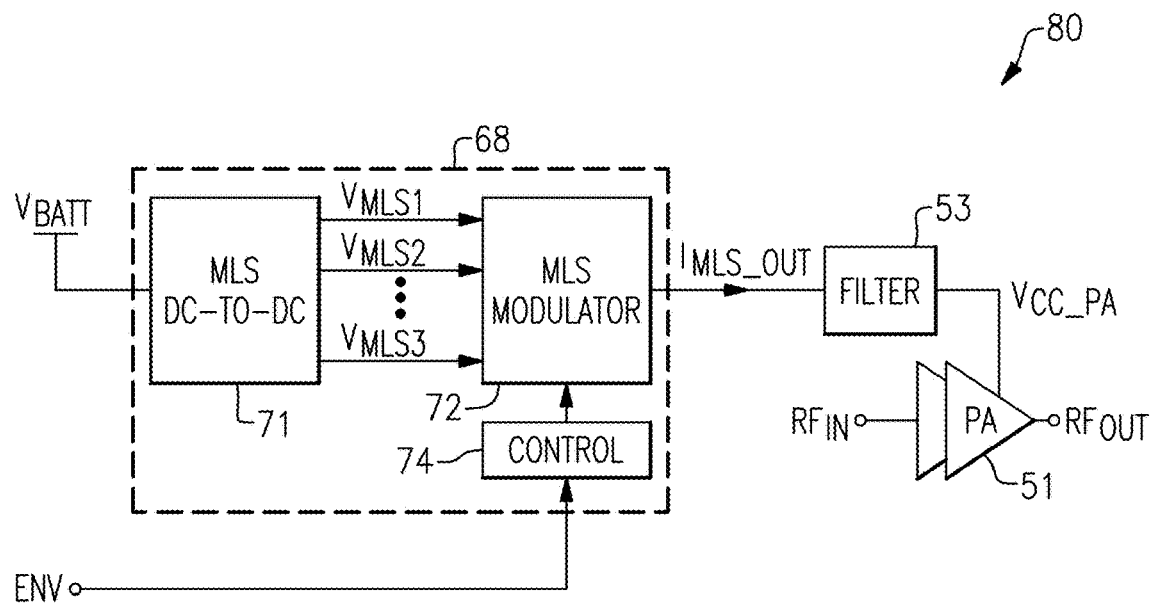
FIG. 3A is a schematic diagram of one embodiment of an envelope tracking system for a power amplifier.

FIG. 3A is a schematic diagram of one embodiment of an envelope tracking system 80 for a power amplifier 51. The envelope tracking system 80 includes a multi-level switching circuit 68 that provides an MLS output current $I_{MLS\_OUT}$ to a supply voltage filter 53, which in turn provides a power amplifier supply voltage $V_{CC\_PA}$ to the power amplifier 51.

As shown in FIG. 3A, the power amplifier 51 amplifies an RF input signal RF IN to generate an RF output signal $RF_{OUT}$. Although depicted as including two stages, the power amplifier 51 can include more or fewer stages.

In the illustrated embodiment, the multi-level switching circuit 68 is powered by a battery voltage $V_{BATT}$. Additionally, the multi-level switching circuit 68 receives an envelope signal ENV, which changes in relation to an envelope of the RF input signal RF IN. The multi-level switching circuit 68 processes the envelope signal ENV to generate the output current $I_{MLS\_OUT}$. The multi-level switching circuit 68 includes an MLS DC-to-DC converter 71, an MLS modulator 72, and a control circuit 74.

As shown in FIG. 3A, the MLS DC-to-DC converter 71 receives a battery voltage $V_{BATT}$ and generates multiple regulated voltages, corresponding to a first regulated voltage $V_{MLS1}$, a second regulated voltage $V_{MLS2}$, and a third regulated voltage $V_{MLS3}$, in this example. Although an example with the MLS DC-to-DC converter 71 generating three regulated voltages is shown, the MLS DC-to-DC converter 71 can generate more or fewer regulated voltages. The MLS DC-to-DC converter 71 can be implemented in a wide variety of ways, including, but not limited to, as a buck-boost converter operable to generate one or more buck voltages below the battery voltage V BATT and/or one or more boost voltages above the battery voltage $V_{BATT}$.

With continuing reference to FIG. 3A, the control circuit 74 processes an envelope signal ENV to generate control signals for the MLS modulator 72. When operating in an envelope tracking mode, the MLS modulator 72 processes the control signals and the MLS regulated voltages to generate the output current $I_{MLS\_OUT}$ to change in relation to or track the envelope signal ENV. In certain implementations, the MLS modulator 72 includes a bank of switches that are selectively activated using the control signals from the control circuit 74. In certain implementations, the multi-level switching circuit 68 is a multi-mode circuit that can provide not only the envelope tracking mode, but other mode(s) as well, such as an APT mode and/or fixed voltage mode.

When transitioning from selection of one of the MLS regulated voltages to another, the control circuit 74 provides a soft or gradual transition in accordance with the teachings herein. By providing a soft transition, a number of advantages are provided, including, but not limited to, less ringing of the output current $I_{MLS\_OUT}$, reduced quantization noise of the multi-level switching circuit 68, and/or relaxed design constraints of the supply voltage filter 53.

Figure 3B:
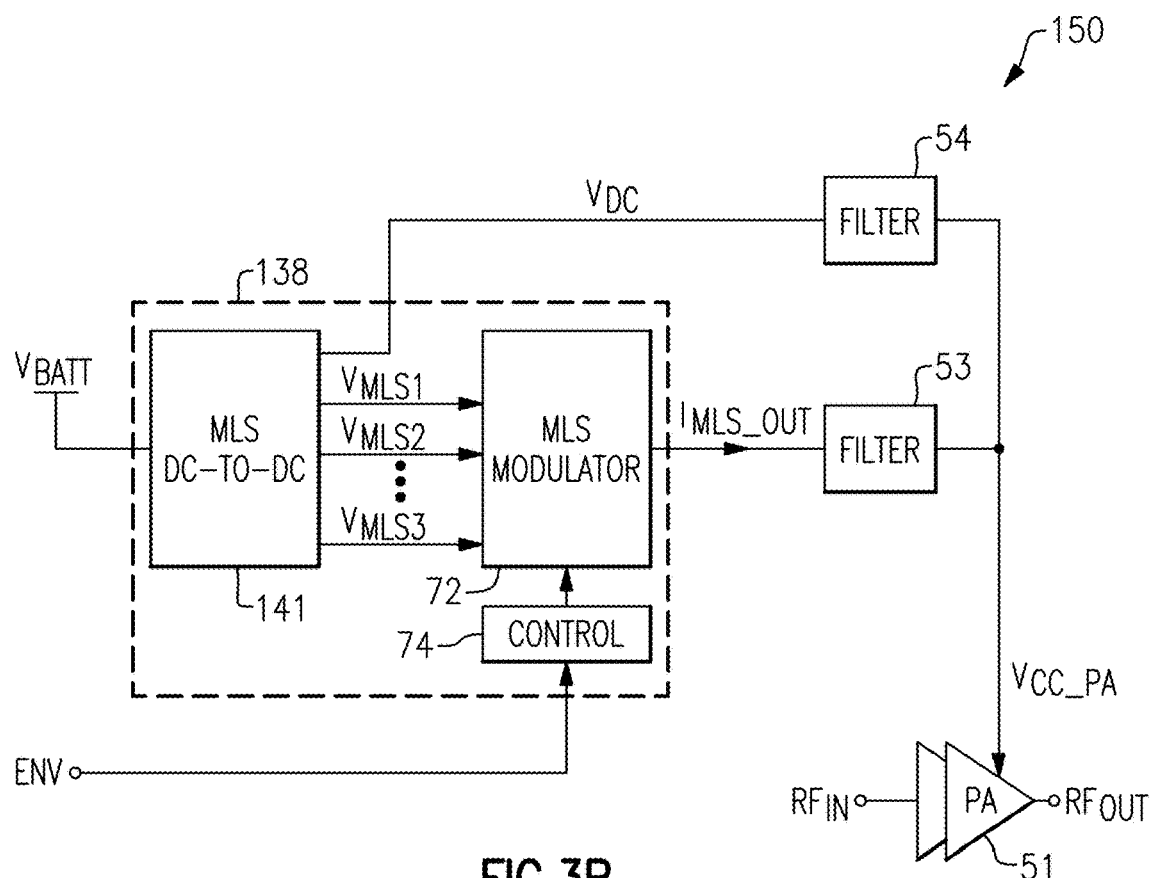
FIG. 3B is a schematic diagram of another embodiment of an envelope tracking system for a power amplifier.

FIG. 3B is a schematic diagram of another embodiment of an envelope tracking system 150 for a power amplifier 51. The envelope tracking system 150 includes a multi-level switching circuit 138 that provides an MLS output current $I_{MLS\_OUT}$ to a first supply voltage filter 53 and a DC voltage Vic to a second supply voltage filter 54. Additionally, the outputs of the first supply voltage filter 53 and the second supply voltage filter 54 are combined to generate a power amplifier supply voltage $V_{CC\_PA}$ to the power amplifier 51.

By implementing the envelope tracking system 150 in this manner, enhanced efficiency can be achieved.

As shown in FIG. 3B, the multi-level switching circuit 138 an MLS DC-to-DC converter 141, an MLS modulator 72, and a control circuit 74. In comparison to the MLS DC-to-DC converter 71 of FIG. 3A, the MLS DC-to-DC converter 141 generates not only the first regulated voltage $V_{MLS1}$, the second regulated voltage $V_{MLS2}$, and the third regulated voltage $V_{MLS3}$, but also the DC voltage $V_{DC}$ that is provided to the second supply voltage filter 54.

Thus, in the illustrated embodiment the regulated DC voltage Vic is adjusted by the output current $I_{MLS\_OUT}$ to generate a power amplifier supply voltage $V_{CC\_PA}$ for the power amplifier 51.

Figure 4A:
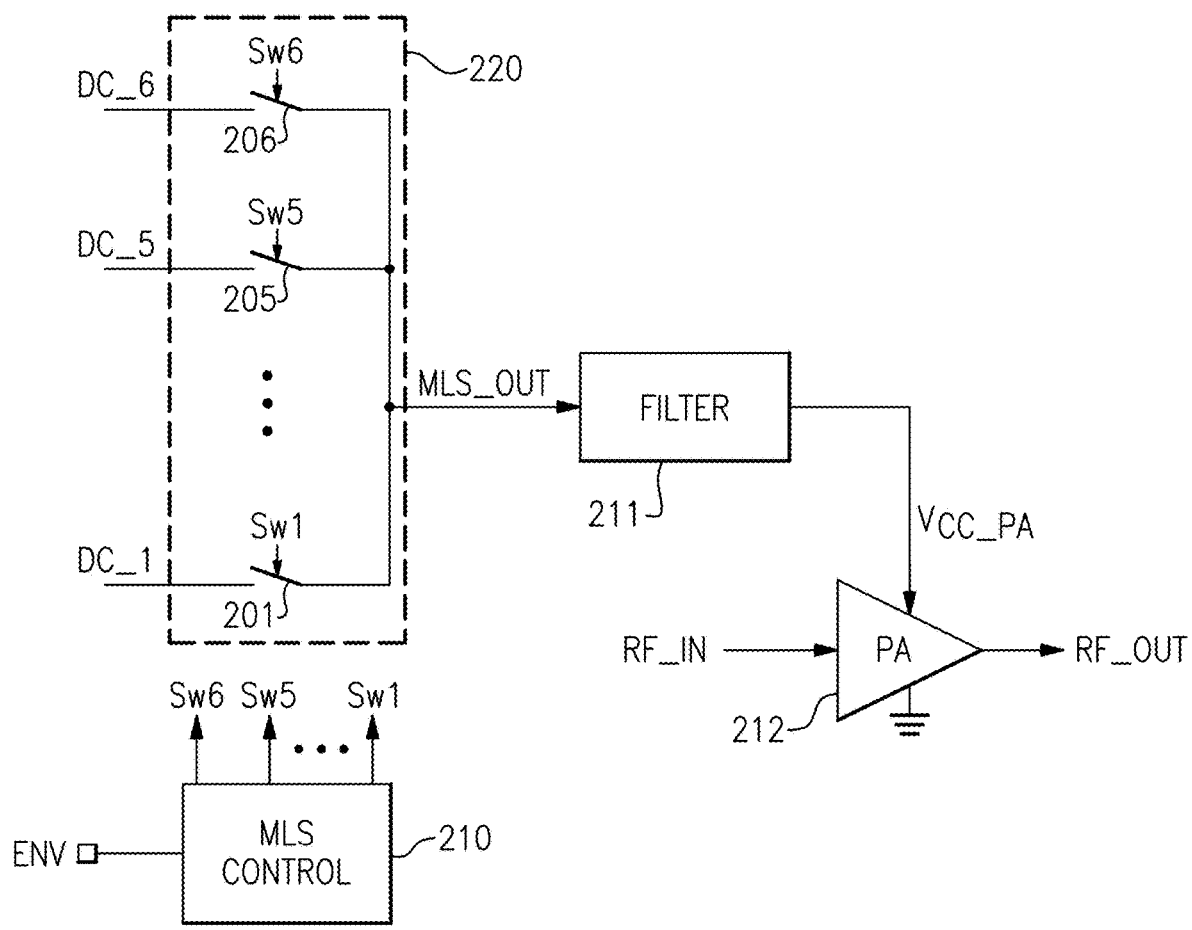
FIG. 4A is a schematic diagram of one example of a multi-level supply (MLS) modulator that operates without soft switching.

FIG. 4A is a schematic diagram of one example of an MLS modulator 220 that operates without soft switching. The MLS modulator 220 generates an output current at an output MLS_OUT. The output current is provided to a supply voltage filter 211, which in turn generates a power amplifier supply voltage $V_{CC\_PA}$ for a power amplifier 212. As shown in FIG. 4A, the power amplifier 212 amplifies an RF input signal RF IN to generate an RF output signal RF OUT.

The MLS modulator 220 includes switches 201, ... 205, 206 are connected between the output MLS_OUT and regulated DC voltages DC_1, ... DC_5, DC_6, respectively. Circuitry for generating the regulated DC voltages DC_1, ... DC_5, DC_6 is not shown in FIG. 4A. Although depicted as including three switches, the MLS modulator 220 can include more or fewer switches as indicated by the ellipses.

The MLS modulator 220 is controlled by an MLS control circuit 210 that generates switch controls signals Sw1, ... Sw5, Sw6 for controlling switches 201, ... 205, 206, respectively. The MLS control circuit 210 changes selection of the switches over time based on an envelope signal ENVELOPE.

Figure 4B:
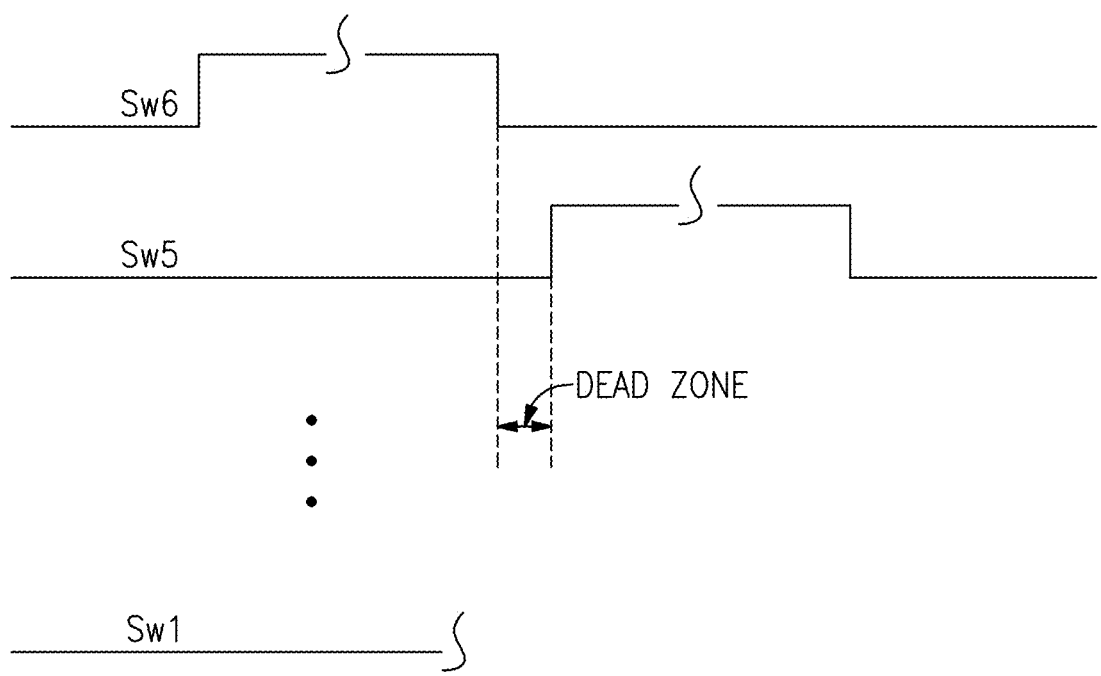
FIG. 4B is one example of a timing diagram for the MLS modulator of FIG. 4A.

FIG. 4B is one example of a timing diagram for the MLS modulator 220 of FIG. 4A. As shown in FIG. 4B, when transitioning from selection of regulated DC voltage DC_6 to regulated DC voltage DC_5, the MLS control circuit 210 provides a period of non-overlap in which both the switch 205 and the switch 206 are opened. Opening the switches in this manner prevents shoot through current from the regulated DC voltage DC_6 to the regulated DC voltage DC_5 (which are at different voltage potentials), but also causes current ringing and/or noise.

Figure 5A:
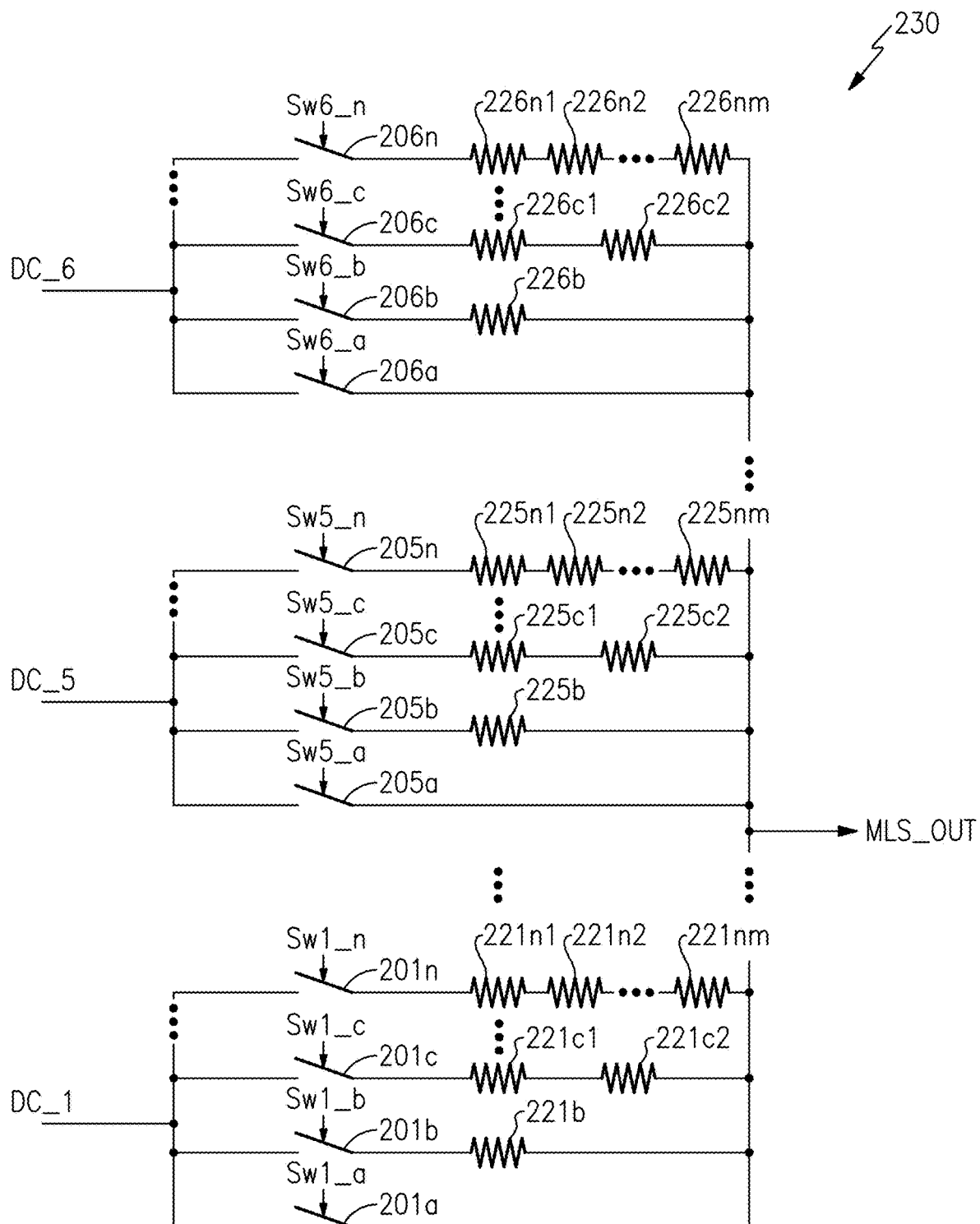
FIG. 5A is a schematic diagram of one embodiment of an MLS modulator that operates with soft switching.

FIG. 5A is a schematic diagram of one embodiment of an MLS modulator 230 that operates with soft switching.

As shown in FIG. 5A, the MLS modulator 230 includes multiple electrical paths between an output MLS_OUT and a corresponding regulated voltage. Additionally, each of the electrical paths is associated with different resistance to facilitate an MLS control circuit to control the MLS modulator 230 to provide a gradual transition from selecting one of regulated DC voltage to another regulated DC voltage.

For example, with respect to the electrical paths between the output MLS_OUT and the regulated DC voltage DC_1, the MLS modulator 230 includes a first path through switch 201a, a second path through switch 201b and resistor 221b, a third path through switch 201c and resistors 221c1 and 221c2, and an nth path through switch 201n and resistors 221n1, 221n2, ... 221nm. Each of the n paths has different resistances, and n can be any desired value desired for the MLS modulator 230.

As shown in FIG. 5A, the switches 201a, 201b, 201c, ... 201n are controlled by switch control signals Sw1_a, Sw1_b, Sw1_c, ... Sw1_n, respectively. Thus, each of the switches 201a, 201b, 201c, ... 201n are separately controlled by an MLS control circuit to provide flexibility in gradually changing the resistance between the output MLS_OUT and the regulated voltage DC_1.

With continuing reference to FIG. 5A, with respect to the electrical paths between the output MLS_OUT and the regulated DC voltage DC_5, the MLS modulator 220 includes a first path through switch 205a, a second path through switch 205b and resistor 225b, a third path through switch 205c and resistors 225c1 and 225c2, and an nth path through switch 205n and resistors 225n1, 225n2, ... 225nm. The switches 205a, 205b, 205c, ... 205n are controlled by switch control signals Sw5_a, Sw5_b, Sw5_c, ... Sw5_n, respectively.

Furthermore, with respect to the electrical paths between the output MLS_OUT and the regulated DC voltage DC_6, the MLS modulator 220 includes a first path through switch 206a, a second path through switch 206b and resistor 226b, a third path through switch 206c and resistors 226c1 and 226c2, and an nth path through switch 206n and resistors 226n1, 22562, ... 226nm. The switches 205a, 205b, 205c, ... 205n are controlled by switch control signals Sw6_a, Sw6_b, Sw6_c, ... Sw6_n, respectively.

Although the MLS modulator 230 depicts an example in which each bank of switches between a given regulated voltage and the output $M_{LS\_OUT}$ has the same configuration, the teachings herein are also applicable to implementations in which the switch banks vary from one regulated voltage to another. Thus, the switch banks can be asymmetric.

Figure 5B:
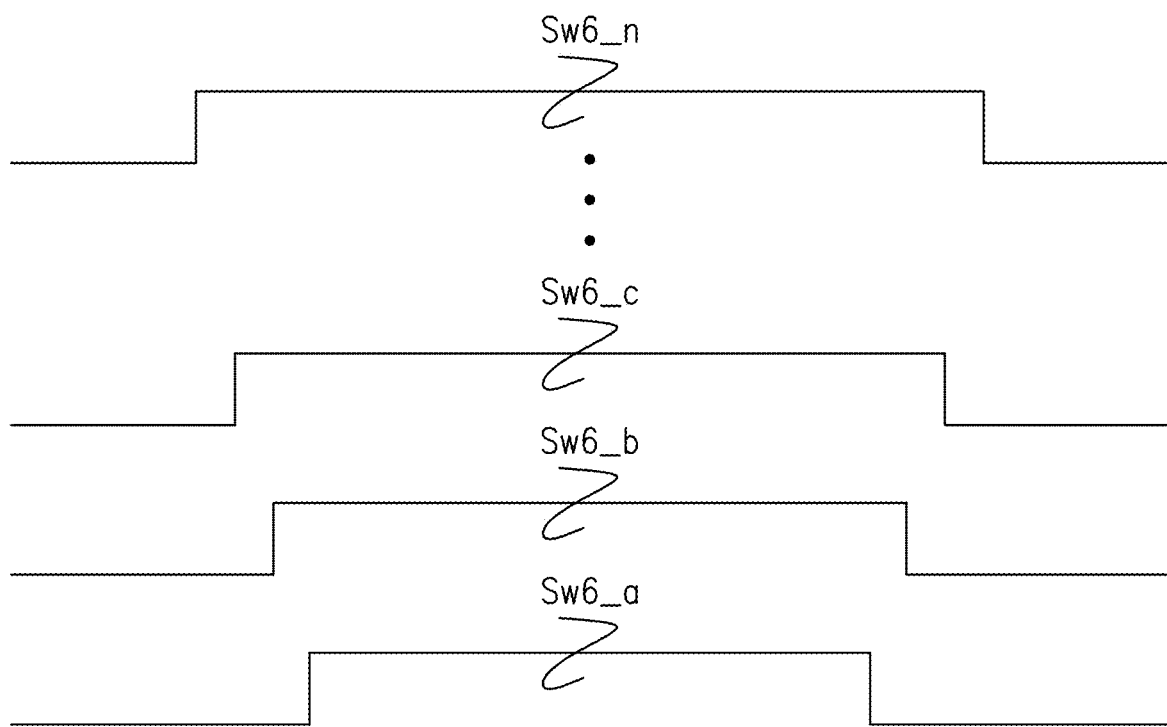
FIG. 5B is one example of a timing diagram for the MLS modulator of FIG. 5A.

FIG. 5B is one example of a timing diagram for the MLS modulator 230 of FIG. 5A. As shown in FIG. 5B, timing for the switch control signals Sw6_a, Sw6_b, Sw6_c, ... Sw6_n is depicted. Additionally, the MLS modulator 230 begins in a first state in which the output MLS_OUT is disconnected from the regulated voltage DC_6, and is gradually transitioned (by way of modulating resistance) to a second state in which all the electrical paths between the regulated voltage DC_6 and the output MLS_OUT are turned on. Thereafter, the electrical paths are deactivated in sequence to return the MLS modulator 230 to the first state.

Although one example of timing is depicted, the MLS modulator 230 can be controlled in a wide variety of ways.

Figure 5C:
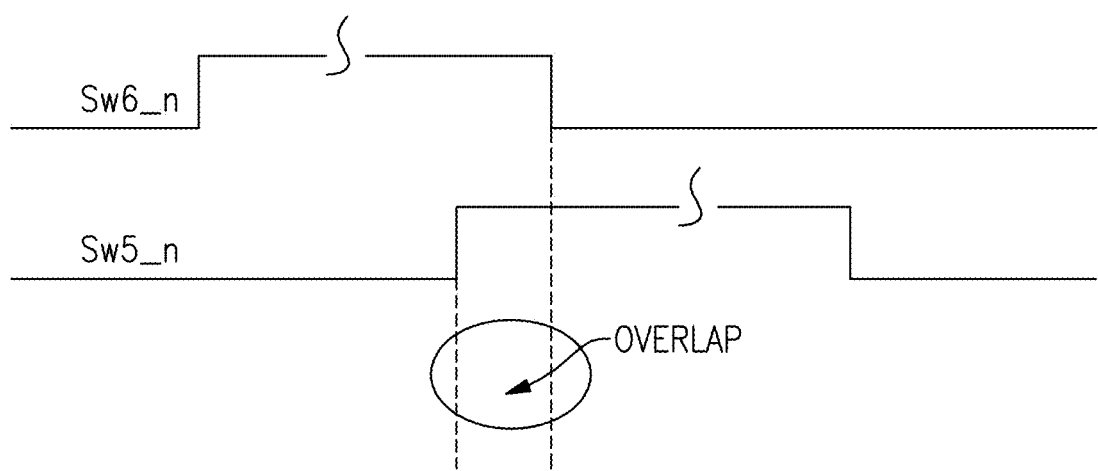
FIG. 5C is another example of a timing diagram for the MLS modulator of FIG. 5A.

FIG. 5C is another example of a timing diagram for the MLS modulator 230 of FIG. 5A. The timing diagram depicts timing of switch control signal Sw6_n and switch control signal Sw5_n.

As shown in FIG. 5C, when transitioning from selection of the regulated voltage DC_6 to the regulated voltage DC_5, the MLS modulator 230 operates with a period of overlap in which both the regulated voltage DC_6 to the regulated voltage DC_5 are connected to the output MLS_OUT by way of resistive paths since both the switch 206n and the switch 205n are turned on.

Figure 6:
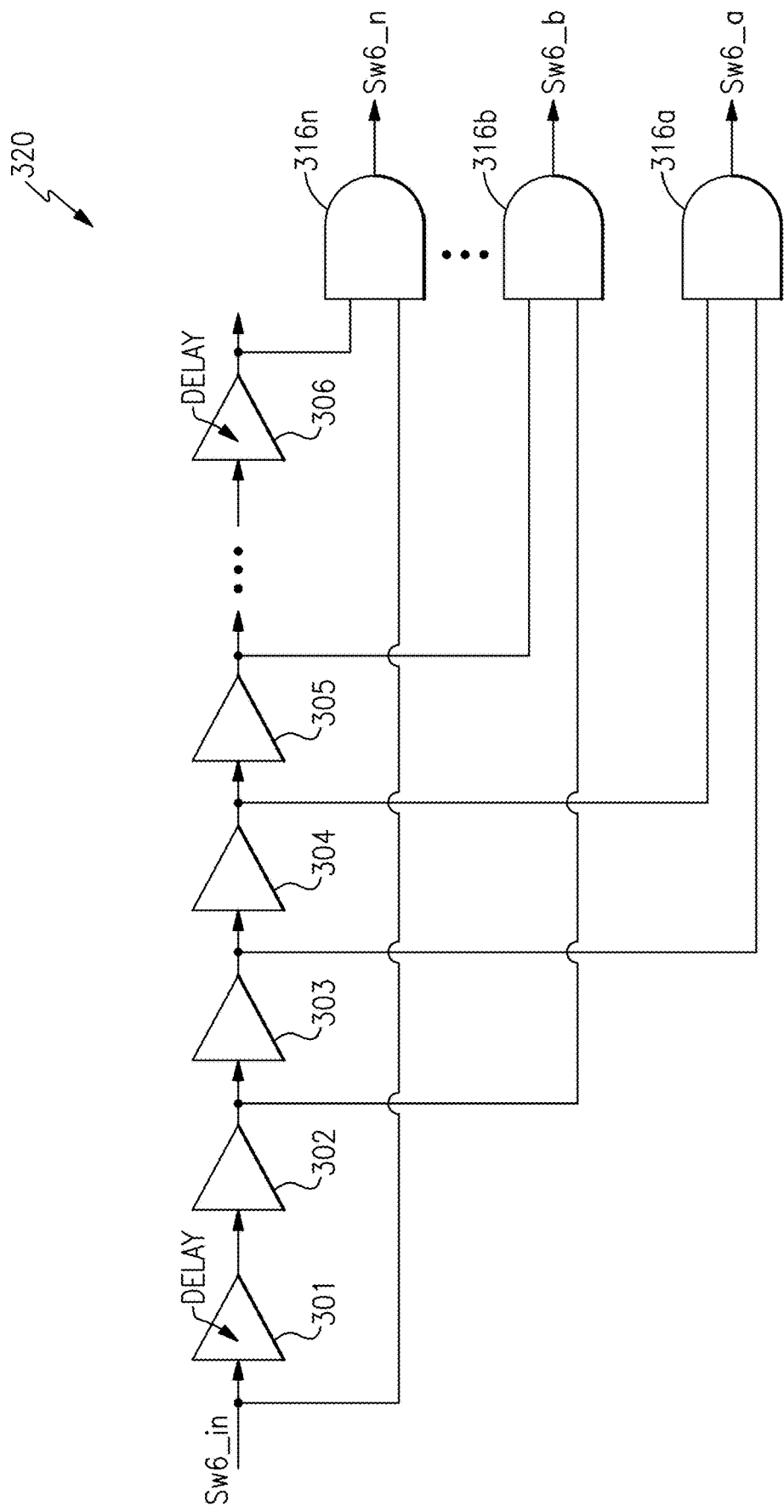
FIG. 6 is a schematic diagram of one embodiment of a control circuit for an MLS modulator.

FIG. 6 is a schematic diagram of one embodiment of a control circuit 320 for an MLS modulator. The control circuit 320 includes delay elements 301, 302, 303, 304, 305, ... 306 and logical AND gates 316a, 316b, ... 316n.

The first delay element receives an input signal SW6_in, and the logical AND gates 316a, 316b, ... 316n perform AND operations of delayed versions of the input signal SW6_in to generate switch control signals Sw6_a, Sw6_b, . . . Sw6_n, respectively.

Although one example of a control circuit is shown, the teachings herein are applicable to MLS control circuitry implemented in a wide variety of ways.

Figure 7:
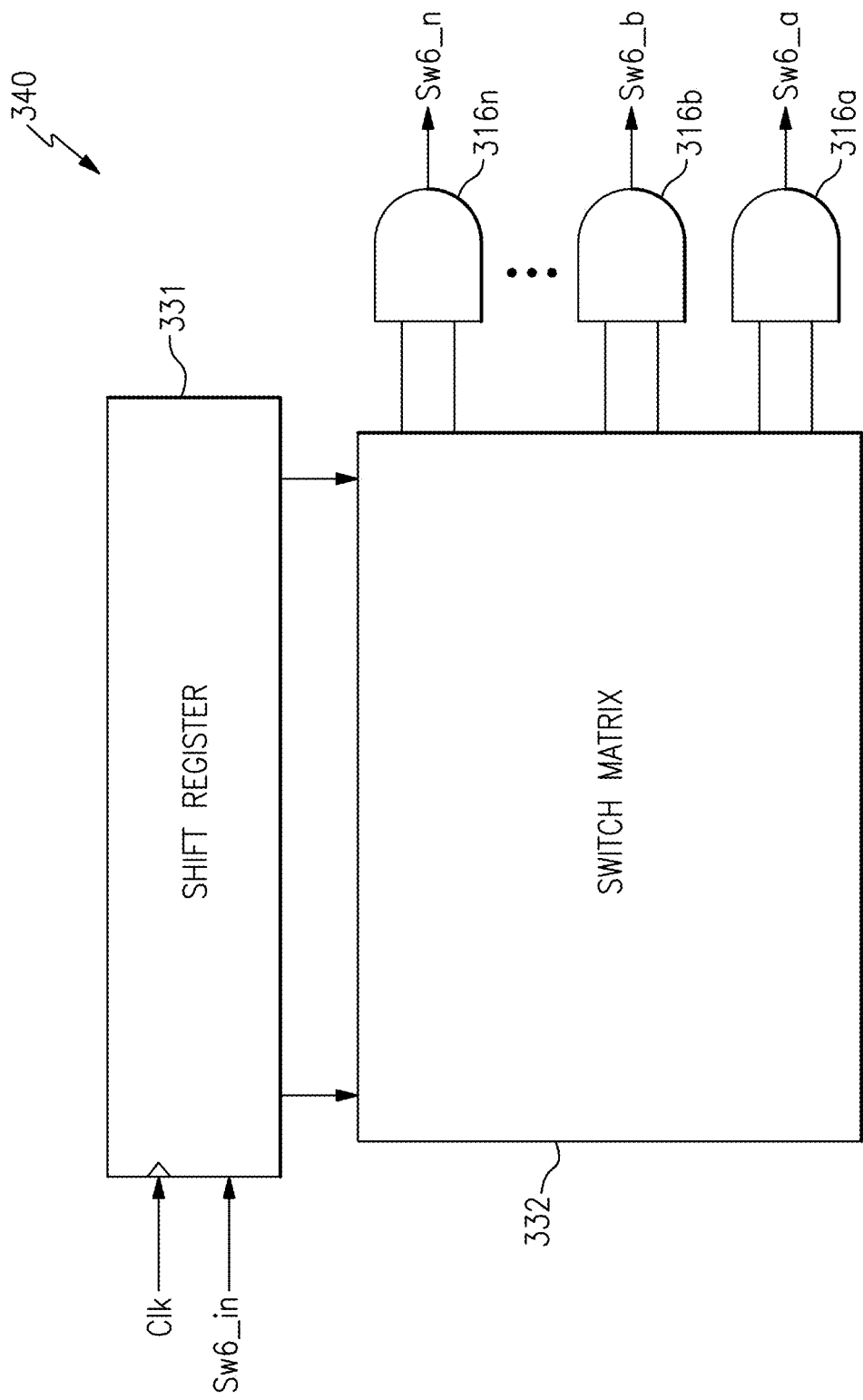
FIG. 7 is a schematic diagram of another embodiment of a control circuit for an MLS modulator.

FIG. 7 is a schematic diagram of another embodiment of a control circuit 340 for an MLS modulator. The control circuit 340 includes a shift register 331, a switch matrix 332, and logical AND gates 316a, 316b, . . . 316n.

The shift register 331 processes a clock signal CLK and an input signal SW6_in to generate multiple delayed versions of the input signal SW6_in that are provided to the switch matrix 332. Additionally, the switch matrix 332 is configurable to provide desired delayed versions of the input signal SW6_in (with or without inversions) to each of the logical AND gates 316a, 316b, . . . 316n.

Thus, enhanced flexibility for generating the switch control signals Sw6_a, Sw6_b, Sw6_c, . . . Sw6_n is provided.

Figure 8:
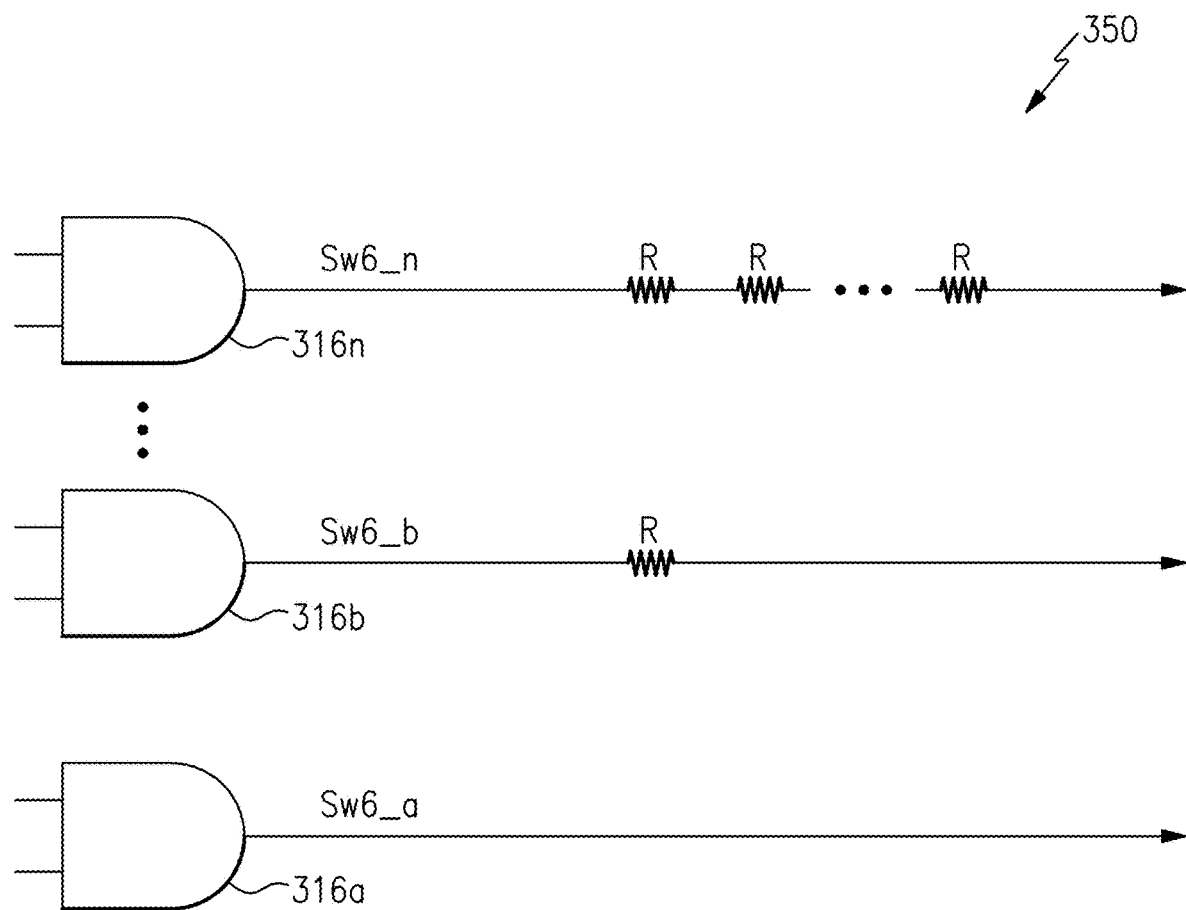
FIG. 8 is a schematic diagram of another embodiment of a control circuit for an MLS modulator.

FIG. 8 is a schematic diagram of another embodiment of a control circuit 350 for an MLS modulator. The control circuit 350 includes logical AND gates 316a, 316b, . . . 316n for generating the switch control signals Sw6_a, Sw6_b, Sw6_c, . . . Sw6_n, respectively. As shown in FIG. 8, the logical AND gates 316a, 316b, . . . 316n are associated with different resistances to provide delay between the switch control signals Sw6_a, Sw6_b, Sw6_c, . . . Sw6_n.

Figure 9:
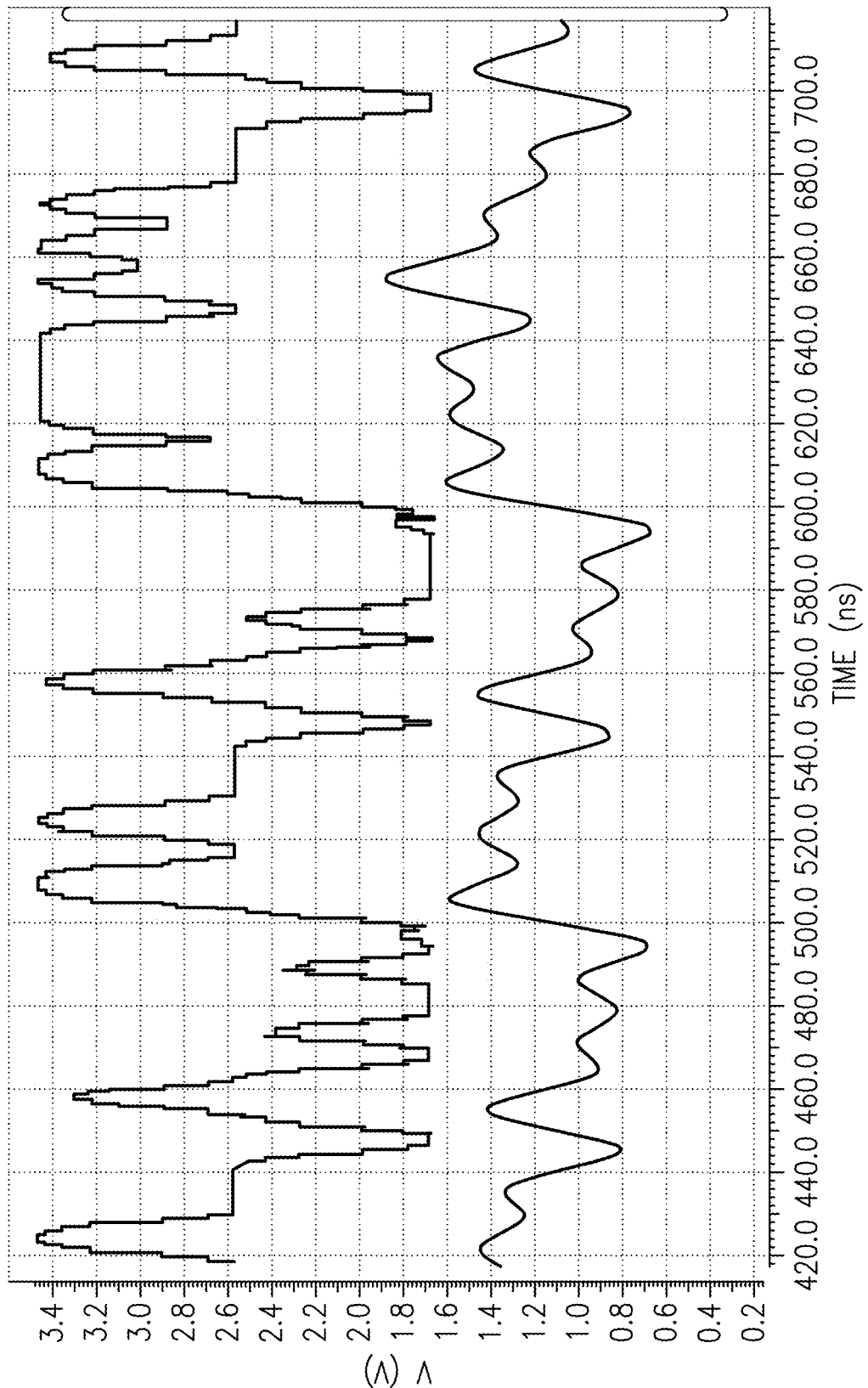
FIG. 9 is a graph of one example of simulation results for an MLS modulator in accordance with one embodiment.

FIG. 9 is a graph of one example of simulation results for an MLS modulator in accordance with one embodiment. The simulation depicts an example of a power amplifier supply voltage generated by an MLS modulator in response to an envelope signal.

Although one example of simulation results are depicted, simulation results can vary based on a number of factors, including, but not limited to, simulation parameters, circuit models, simulation tools, circuit topology, and/or a wide variety of other factors.

Figure 10:
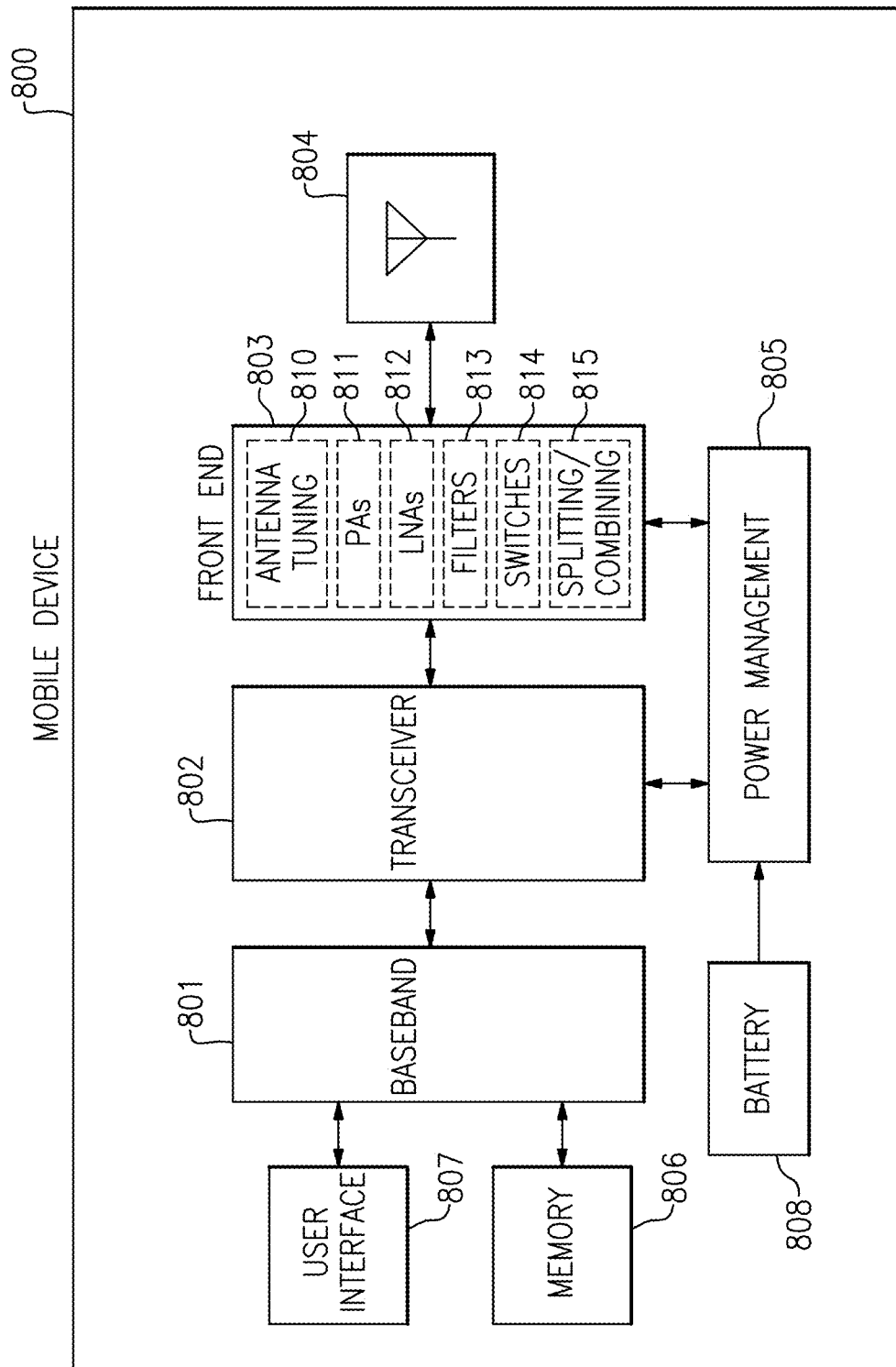
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
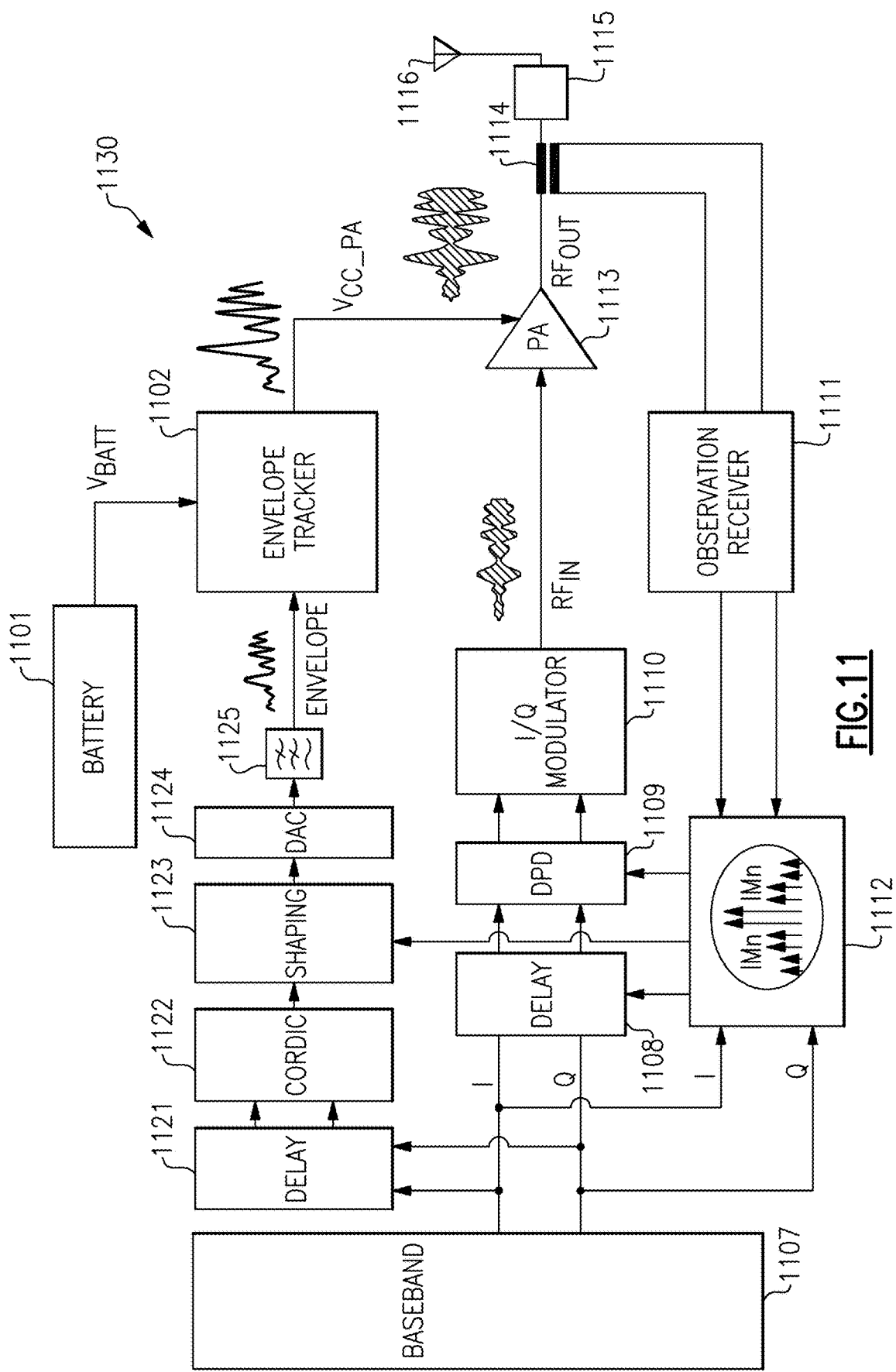
FIG. 11 is a schematic diagram of one embodiment of a communication system for transmitting RF signals.

FIG. 11 is a schematic diagram of one embodiment of a communication system 1130 for transmitting RF signals. The communication system 1130 includes a battery 1101, an envelope tracker 1102, a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal RF IN. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 11, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal RF IN. The power amplifier 1113 receives the RF signal RF IN from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal RF IN. In certain implementations, the intermodulation detection circuit 1112 also serves to control shaping provided by the shaping circuit 1123.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 12:
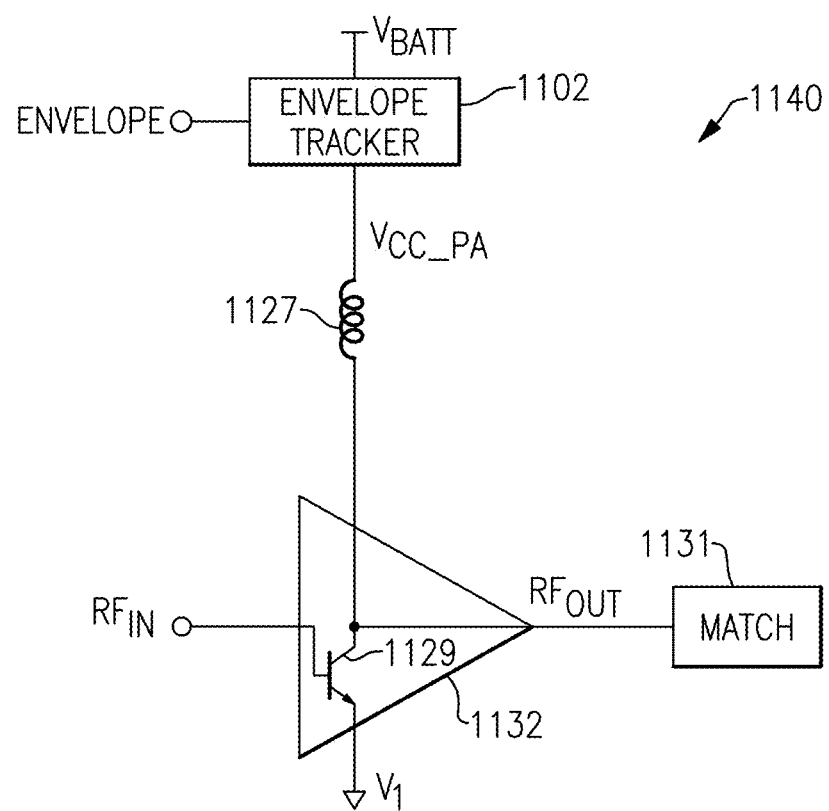
FIG. 12 is a schematic diagram of one example of a power amplifier system including an envelope tracker.

FIG. 12 is a schematic diagram of one example of a power amplifier system 1140 including an envelope tracker 1102. The illustrated power amplifier system 1140 further includes an inductor 1127, an output impedance matching circuit 1131, and a power amplifier 1132. The illustrated envelope tracker 1102 receives a battery voltage $V_{BATT}$ and an envelope of the RF signal and generates a power amplifier supply voltage $V_{CC\_PA}$ for the power amplifier 1132.

The illustrated power amplifier 1132 includes a bipolar transistor 1129 having an emitter, a base, and a collector. As shown in FIG. 12, the emitter of the bipolar transistor 1129 is electrically connected to a power low supply voltage $V_1$, which can be, for example, a ground supply. Additionally, an RF signal (RF IN) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ generated by the envelope tracker 1102 while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 12 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 13A:
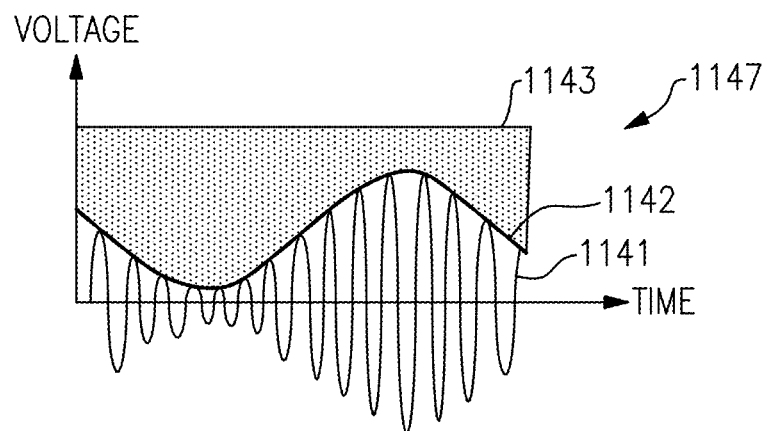
FIG. 13A shows a first example of a power amplifier supply voltage versus time.
Figure 13B:
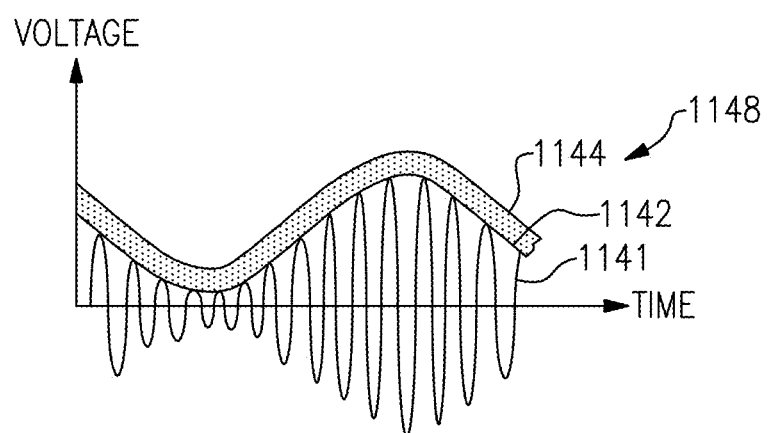
FIG. 13B shows a second example of a power amplifier supply voltage versus time.

FIGS. 13A and 13B show two examples of power amplifier supply voltage versus time.

In FIG. 13A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142.

However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 13B, a graph 1148 illustrates another example of the voltage of an RF signal 1141 and a power amplifier supply voltage 1144 versus time. In contrast to the power amplifier supply voltage 1143 of FIG. 13A, the power amplifier supply voltage 1144 of FIG. 13B changes in relation to the envelope 1142 of the RF signal 1141. The area between the power amplifier supply voltage 1144 and the envelope 1142 in FIG. 13B is less than the area between the power amplifier supply voltage 1143 and the envelope 1142 in FIG. 13A, and thus the graph 1148 of FIG. 13B can be associated with a power amplifier system having greater energy efficiency.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a front end circuit including a power amplifier configured to amplify a radio frequency signal and to receive power from a power amplifier supply voltage; and
a power management circuit including an envelope tracker configured to control the power amplifier supply voltage based on an envelope signal indicating an envelope of the radio frequency signal, the envelope tracker including a first controllable resistance between a first regulated voltage and the power amplifier supply voltage and a second controllable resistance between a second regulated voltage and the power amplifier supply voltage, the first regulated voltage and the second regulated voltage of different voltage levels, the first controllable resistance including a first plurality of selectable paths each having a different resistance, the first plurality of selectable paths each including a resistor and a switch.

2. The mobile device of claim 1 wherein the envelope tracker further includes a control circuit configured to control a resistance value of the first controllable resistance and a resistance value of the second controllable resistance to provide a transition from selecting the first regulated voltage to selecting the second regulated voltage.

3. The mobile device of claim 2 wherein the second controllable resistance includes a second plurality of selectable paths.

4. The mobile device of claim 3 wherein the transition is from a first state in which all of the first plurality of selectable paths are selected and none of the second plurality of selectable paths are selected to a second state in which all of the second plurality of selectable paths are selected and none of the first plurality of selectable paths are selected.

5. The mobile device of claim 3 wherein the transition includes a period of overlap in which at least one of the first plurality of selectable paths is selected and at least one of the second plurality of selectable paths is selected.

6. The mobile device of claim 1 wherein the envelope tracker includes a control circuit configured to control a resistance value of the first controllable resistance and a resistance value of the second controllable resistance based on the envelope signal.

7. The mobile device of claim 1 further comprising a transceiver configured to generate the radio frequency signal.

8. A method of envelope tracking, the method comprising:
amplifying a radio frequency signal using a power amplifier;
powering the power amplifier using a power amplifier supply voltage; and
controlling the power amplifier supply voltage based on an envelope signal indicating an envelope of the radio frequency signal using an envelope tracker, the envelope tracker including a first controllable resistance between a first regulated voltage and the power amplifier supply voltage and a second controllable resistance between a second regulated voltage and the power amplifier supply voltage, the first regulated voltage and the second regulated voltage of different voltage levels, the first controllable resistance including a first plurality of selectable paths each having a different resistance, the first plurality of selectable paths each including a resistor and a switch.

9. The method of claim 8 further comprising controlling a resistance value of the first controllable resistance and a resistance value of the second controllable resistance to provide a transition from selecting the first regulated voltage to selecting the second regulated voltage.

10. The method of claim 9 wherein controlling the resistance value of the second controllable resistance includes controlling selection of a second plurality of selectable paths.

11. The method of claim 10 further comprising controlling the envelope tracker to operate in a period of overlap in which at least one of the first plurality of selectable paths is selected and at least one of the second plurality of selectable paths is selected.

12. The method of claim 10 wherein the transition is from a first state in which all of the first plurality of selectable paths are selected and none of the second plurality of selectable paths are selected to a second state in which all of the second plurality of selectable paths are selected and none of the first plurality of selectable paths are selected.

13. An envelope tracking system comprising:
a filter configured to filter a power amplifier supply voltage of a power amplifier that amplifies a radio frequency signal; and
an envelope tracker configured to control the power amplifier supply voltage based on an envelope signal indicating an envelope of the radio frequency signal, the envelope tracker including a first controllable resistance between a first regulated voltage and the power amplifier supply voltage and a second controllable resistance between a second regulated voltage and the power amplifier supply voltage, the first regulated voltage and the second regulated voltage of different voltage levels, the first controllable resistance including a first plurality of selectable paths each having a different resistance, the first plurality of selectable paths each including a resistor and a switch.

14. The envelope tracking system of claim 13 wherein the envelope tracker further includes a control circuit configured to control a resistance value of the first controllable resistance and a resistance value of the second controllable resistance to provide a transition from selecting the first regulated voltage to selecting the second regulated voltage.

15. The envelope tracking system of claim 14 wherein the second controllable resistance includes a second plurality of selectable paths.

16. The envelope tracking system of claim 15 wherein the transition is from a first state in which all of the first plurality of selectable paths are selected and none of the second plurality of selectable paths are selected to a second state in which all of the second plurality of selectable paths are selected and none of the first plurality of selectable paths are selected.

17. The envelope tracking system of claim 15 wherein the transition includes a period of overlap in which at least one of the first plurality of selectable paths is selected and at least one of the second plurality of selectable paths is selected.

18. The envelope tracking system of claim 13 wherein the envelope tracker includes a control circuit to control a resistance value of the first controllable resistance and a resistance value of the second controllable resistance based on the envelope signal.

19. The method of claim 8 further comprising controlling a resistance value of the first controllable resistance and a resistance value of the second controllable resistance based on the envelope signal.

20. The method of claim 8 further comprising generating the radio frequency signal using a transceiver.

* * * * *